United States Patent
Lin et al.

(10) Patent No.: US 6,627,388 B2
(45) Date of Patent: Sep. 30, 2003

(54) METHOD FOR REDUCING ROUGHNESS OF PHOTORESIST THROUGH CROSS-LINKING REACTION OF DEPOSIT AND PHOTORESIST

(75) Inventors: Shun-Li Lin, Hsinchu (TW); Chi-Fang Hsieh, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 122 days.

(21) Appl. No.: 09/900,579

(22) Filed: Jul. 6, 2001

(65) Prior Publication Data
US 2002/0168594 A1 Nov. 14, 2002

(30) Foreign Application Priority Data
May 11, 2001 (TW) .................................. 90111229 A

(51) Int. Cl.⁷ .................................. G03F 7/40
(52) U.S. Cl. ................. 430/315; 430/324; 430/325; 430/326; 430/328; 430/330
(58) Field of Search ................. 430/315, 324, 430/325, 326, 330, 328

(56) References Cited

U.S. PATENT DOCUMENTS 6,451,512 B1 * 9/2002 Rangarajan et al. ........ 430/313

\* cited by examiner

*Primary Examiner*—Christopher G. Young
(74) *Attorney, Agent, or Firm*—J. C. Patents

(57) ABSTRACT

The invention provides a method for reducing roughness of the photoresist through cross-linking reaction of deposit and the photoresist. The method comprises at least performing an exposure process to a substrate having a photoresist pattern and performing a post-exposure bake process for activating the surface of photoresist pattern. A material layer is formed to cover the surface of the photoresist pattern. The material layer cross-links with the hydrogen ions on the surface of the photoresist pattern, so that a filling layer is formed to fills asperity or the rough regions of the photoresist pattern.

12 Claims, 4 Drawing Sheets

METHOD FOR REDUCING ROUGHNESS OF PHOTORESIST THROUGH CROSS-LINKING REACTION OF DEPOSIT AND PHOTORESIST

CROSS-REFERENCE TO RELATED APPLICATION

This application claims the priority benefit of Taiwan application Ser. No. 90111229, filed May 11, 2001.

BACKGROUND OF THE INVENTION

1. Field of Invention

The present invention relates to a method for reducing roughness of the photoresist. More particularly, the present invention relates to a method for reducing roughness of the photoresist through cross-linking reaction of deposit and the photoresist.

2. Description of Related Art

The technique of the photolithography is a very important step in the manufacture process of the semiconductor device. Almost every element in the structure of the MOS device, for example, the pattern of each layer or the doping region, relates to the step of photolithography. As the integration becomes higher, the size of the device keeps decreasing, for a smaller line-width. However, it is also decided by the technique of photolithography whether the line-width can be smaller.

The conventional photolithography process steps include coating, pre-exposure bake (i.e. soft bake), exposure, post-exposure bake, development and hard bake. In the development step, the developer is used to remove undesired photoresist layer, so that the transferred pattern is shown. As shown in FIG. 1, a photoresist pattern 102 is formed over a substrate 100. However, the surface of the line edge of the photoresist pattern 102 is pretty rough, further deteriorating accuracy of the pattern, uniformity of the critical dimension, the yield and the process window. Therefore, it is desired to reduce roughness of the photoresist for ensuring accuracy of the following processes.

The conventional methods for reducing line edge roughness (LER) are raising the temperatures for the soft bake process and the post-exposure bake process, so that the amount of solvent in the photoresist is reduced, thus improving LER of the photoresist pattern. However, it is limited by the structure of the photoresist. Usually, the temperatures for the soft bake process and the post-exposure bake process are maintained between 90 to 110° C. If the temperatures are raised to too high, roughness or wrinkles are formed in the surface of the photoresist, failing to improve LER of the photoresist pattern.

SUMMARY OF THE INVENTION

The invention provides a method for reducing roughness of the photoresist through cross-linking reaction of deposit and the photoresist. A material capable of cross-linking with the photoresist is deposited over the photoresist pattern, to reduce line edge roughness of the photoresist pattern.

The invention provides a method for reducing roughness of the photoresist through cross-linking reaction of deposit and the photoresist. By increasing the concentration of hydrogen ions on the surface of the photoresist pattern, the effect of cross-linking between the deposit and the photoresist is enhanced, thus reducing LER of the pattern. Therefore, uniformity of the critical dimension (CD), the yield and the process window are increased.

The invention provides a method for reducing roughness of the photoresist through cross-linking reaction of deposit and the photoresist. The method comprises at least performing an exposure process to a substrate having a photoresist pattern and performing a post-exposure bake process for activating the surface of photoresist pattern. A material layer is formed to cover the surface of the photoresist pattern. The material layer cross-links with the hydrogen ions on the surface of the photoresist pattern, so that a filling layer is formed to fills asperity or the rough regions of the photoresist pattern.

One of the features of the present invention is to deposit a material that can cross-links with the hydrogen ions on the surface of the photoresist pattern over the developed photoresist pattern. Therefore, the rougher the surface of the photoresist is, the more contact regions there are for the cross-linking reaction between the photoresist and the deposited material. As a result, more reaction products are formed to fill and improve LER of the photoresist pattern.

Furthermore, the developed photoresist pattern has higher hydrogen ion concentration, which helps speed up the cross-linking reaction and increase the amount of reaction products.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
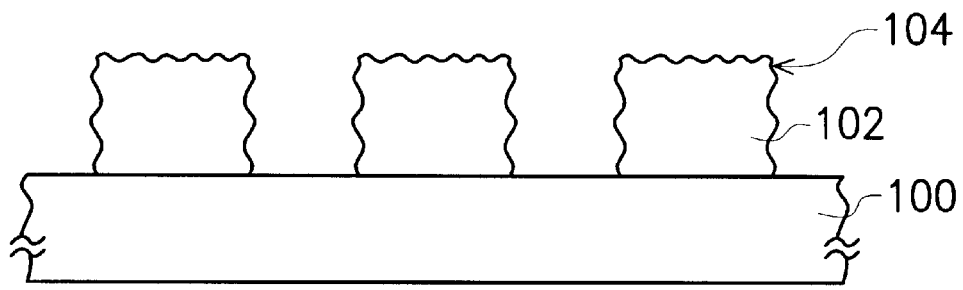
FIG. 1 is a cross-sectional diagram illustrated the conventional developed photoresist pattern.
Figure 2A:
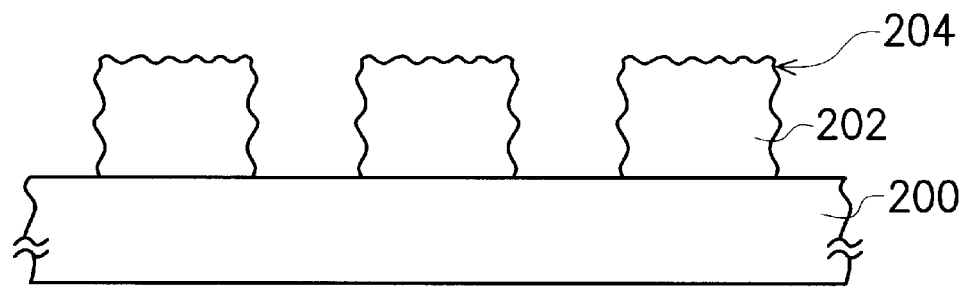
FIG. 2A to FIG. 2C are cross-sectional diagrams illustrate the manufacture processes of a method for reducing roughness of the photoresist through cross-linking reaction of deposit and the photoresist according to one preferred embodiment of this invention.
Figure 2B:
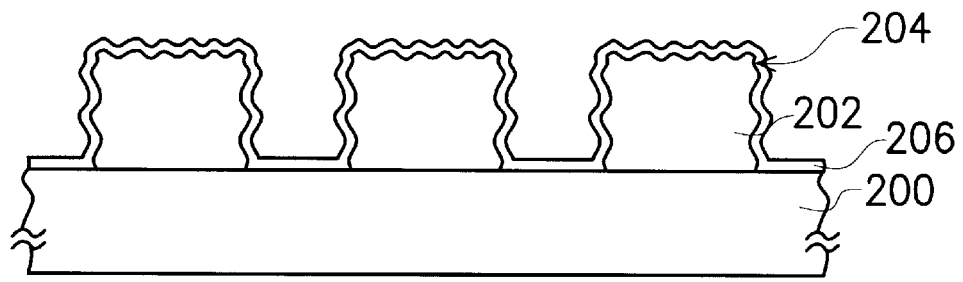
Figure 2C:
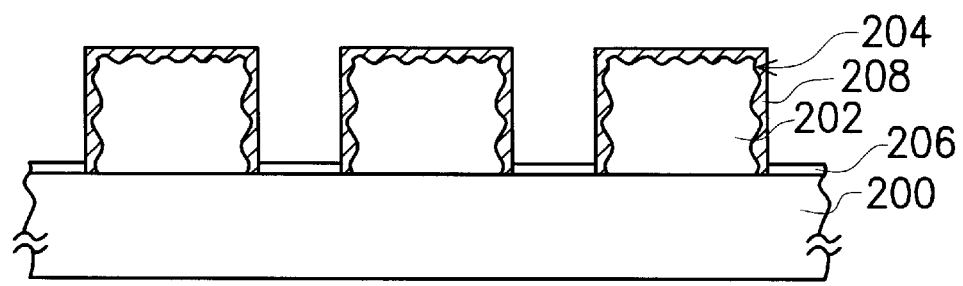

FIG. 2A to FIG. 2C are cross-sectional diagrams illustrate the manufacture processes of a method for reducing roughness of the photoresist through cross-linking reaction of deposit and the photoresist according to one preferred embodiment of this invention.

Referring to FIG. 2A, a substrate 200 is provided. A photoresist pattern 202 is formed on the substrate 200. The photoresist pattern 202 has a rough edge surface 204. The method for forming the photoresist pattern 202 includes coating a photoresist layer (not shown) on the substrate 200; soft bake, exposure, post-exposure bake and development.

Referring to FIG. 2B, a material layer 206 is formed on the surface 204 of the photoresist pattern 202. The material layer 206 can be formed of a material that can easily cross-link with high polar materials, for example, hexamethyldisilazane (HMDS), dimethylsilyldiethylamine (DMSDEA) or Bis(dimethylamino)dimethylsilane (BDMAS). The method for forming the material layer 206 is, for example, chemical vapor deposition, coating, or spraying.

There are hydrogen ions on the surface 204 of the photoresist pattern 202 after development. Because the material layer 206 is formed of a material that can easily cross-link with high polar materials, the material layer 206 cross-links with the hydrogen ions (H+) on the surface 204 of the photoresist pattern 202 to form products. Therefore, the rougher the surface 204 of the photoresist pattern 202 is, the more contact regions there are for the cross-linking reaction between photoresist and the material layer 206. As a result, more reaction products are produced to form a filling lay 208 for filling the rough surface 204 of the photoresist pattern 202, thus improving LER of the photoresist pattern.

FIGS. 3A to FIG. 3D are cross-sectional diagrams illustrate the manufacture processes of a method for reducing roughness of the photoresist through cross-linking reaction of deposit and the photoresist according to another preferred embodiment of this invention.

Figure 3A:
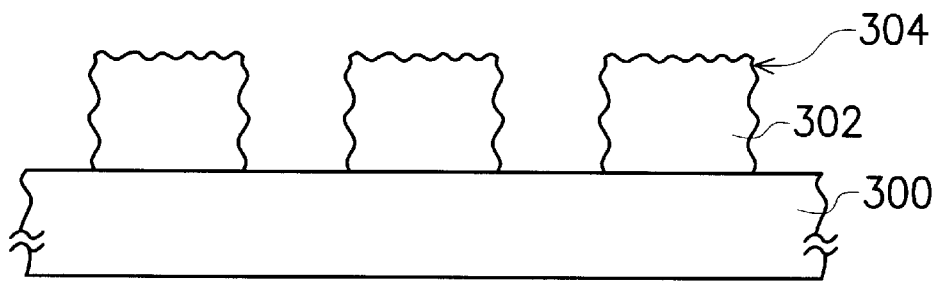
FIG. 3A to FIG. 3D are cross-sectional diagrams illustrate the manufacture processes of a method for reducing roughness of the photoresist through cross-linking reaction of deposit and the photoresist according to another preferred embodiment of this invention.

Referring to FIG. 3A, a substrate 300 is provided. A photoresist pattern 302 is formed on the substrate 300. The photoresist pattern 302 has a rough edge surface 304. The method for forming the photoresist pattern 302 includes coating a photoresist layer (not shown) on the substrate 300; soft bake, exposure, post-exposure bake and development.

Figure 3B:
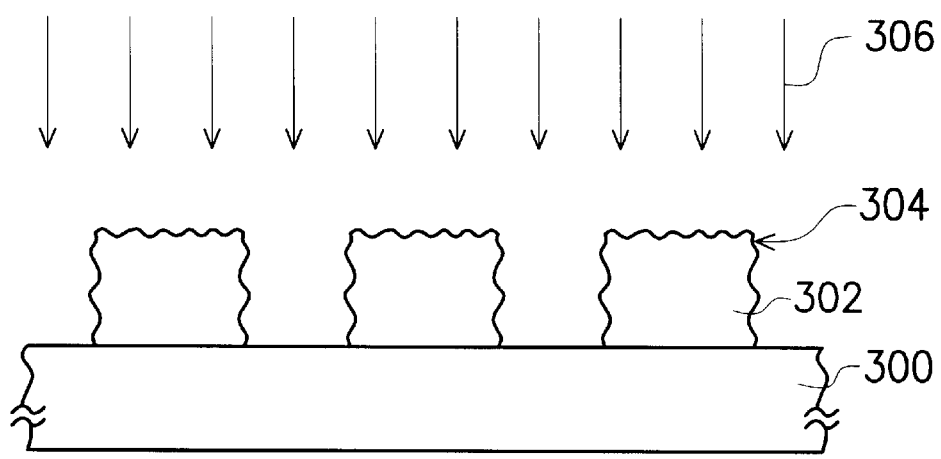

Referring to FIG. 3B, another exposure process is performed to the total substrate 300, in order to activate the surface 304 of the photoresist pattern 302, thus increasing a concentration of hydrogen ions on the surface 304 of the photoresist pattern 302.

A light source 306 of the exposure process is, for example, the wavelength of the I-line: 365 nm, the wavelength of deep UV: 248 nm (D-UV248), the wavelength of deep UV: 193 nm (D-UV193) or the wavelength of deep UV: 157 nm (D-UV157). The energy of I-line applied to the photoresist pattern 302 is, for example, about 10 mJ/cm2 to 500 mJ/cm2. The energy of D-UV248 applied to the photoresist pattern 302 is, for example, about 1 mJ/cm$^2$ to 100 mJ/cm$^2$. The energy of D-UV193 applied to the photoresist pattern 302 is, for example, about 1 mJ/cm$^2$ to 50 mJ/cm$^2$. The energy of D-UV157 applied to the photoresist pattern 302 is, for example, about 1 mJ/cm$^2$ to 50 mJ/cm$^2$.

Furthermore, a post-exposure bake process can be added after the aforementioned exposure process, for further increasing the concentration of the hydrogen ions, thus speeding up the reaction and improving the LER. The post-exposure process has a temperature between 60° C. to 150° C., for example.

Figure 3C:
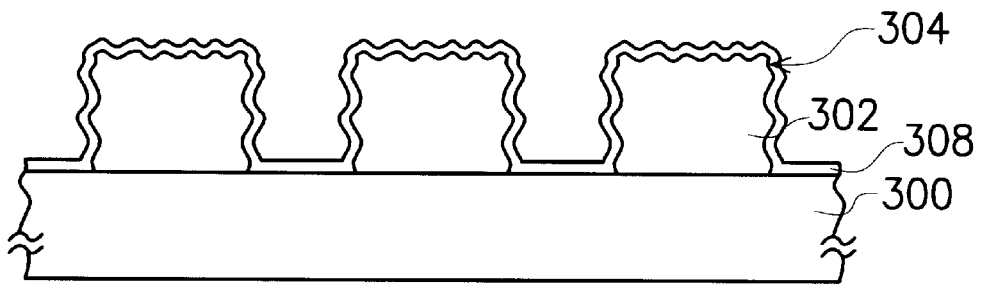
Figure 3D:
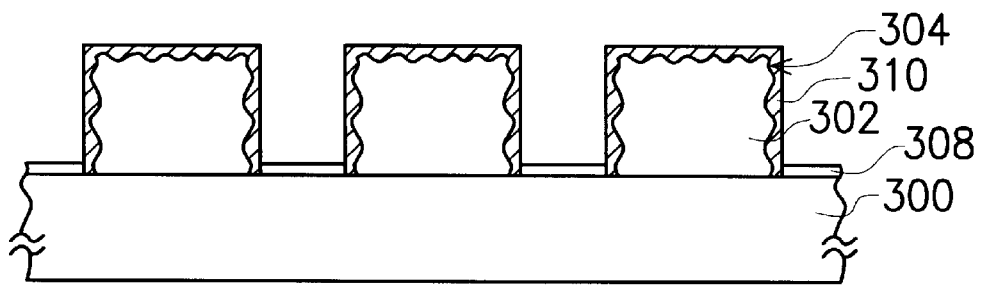

Referring to FIG. 3C, a material layer 308 is formed on the surface 304 of the photoresist pattern 302. The material layer 308 can be formed of a material that can easily cross-link with high polar materials, for example, hexamethyldisilazane (HMDS), dimethylsilyldiethylamine (DMSDEA) or Bis(dimethylamino)dimethylsilane (BDMAS). The method for forming the material layer 308 is, for example, chemical vapor deposition, coating, or spraying.

There are hydrogen ions on the surface 304 of the photoresist pattern 302 after development. Because the material layer 308 is formed of a material that can easily cross-link with high polar materials, the material layer 308 cross-links with the hydrogen ions (H+) on the surface 304 of the photoresist pattern 302 to form products. Therefore, the rougher the surface 304 of the photoresist pattern 302 is, the more contact regions there are for the cross-linking reaction between photoresist and the material layer 308. As a result, more reaction products are produced to form a filling lay 310 for filling the rough surface 304 of the photoresist pattern 302, thus improving LER of the photoresist pattern.

As cited above, the advantages of the present invention are as followings:

(1) The material layer deposited on the developed photoresist pattern can cross-link with the hydrogen ions on the surface of the photoresist pattern, so that asperity or the rough regions of the photoresist pattern are filled by the reaction products, thus improving LER.

(2) By increasing the hydrogen ion concentration higher, the improvement of LER can be enhanced.

The present invention relates to a method for reducing roughness of the photoresist through cross-linking reaction of deposit and the photoresist, which is applicable to both the positive and negative photoresist.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for reducing roughness of a photoresist through cross-linking reaction of a deposit and the photoresist, comprising:

providing a substrate paving a photoresist pattern;

performing an exposure on the photoresist pattern to increase a concentration of hydrogen ions on a surface of the photoresist pattern;

performing a post-exposure bake process to further increase the concentration of hydrogen ions on the surface of the photoresist pattern; and after performing the exposure and the post-exposure bake process, covering a material layer over the surface of the photoresist pattern, so that the material layer cross-links with the hydrogen ions on the surface of the photoresist pattern to form a filling layer, wherein the flling layer can fill up rough regions in the surface of the photoresist pattern.

2. The method as claimed in claim 1, wherein a material of the material layer is selected from the group consisting of hexamethyldisilazane, dimethylsilyldiethylamine and Bis (dimethylamino)dimethylsilane.

3. The method as claimed in claim 1, wherein the exposure process uses a light source selected from the group consisting of I-line, D-UV248, D-UV193, and D-UV157.

4. The method as claimed in claim 3, wherein an energy of the I-line light source applied to the photoresist pattern is in the range of between about 10 mJ/cm$^2$ to 500 mJ/cm $^2$.

5. The method as claimed in claim 3, wherein an energy of the D-UV248 light source applied to the photoresist pattern is in the range of between about 1 mJ/cm$^2$ to 100 mJ/cm$^2$.

6. The method as claimed in claim 3, wherein an energy of the D-UV193 light source applied to the photoresist pattern is in the range of between about 1 mJ/cm$^2$ to 50 mJ/cm$^2$.

7. The method as claimed in claim 3, wherein an energy of the D-UV157 light source applied to the photoresist pattern is in the range of between about 1 mJ/cm$^2$ to 50 mJ/cm$^2$.

8. The method as claimed in claim 1, wherein a temperature of the post-exposure bake process is in the range of between about 60° C. to 150° C.

9. The method as claimed in claim 1, wherein the photoresist pattern can be formed by either positive photoresist or negative photoresist.

10. A method for reducing roughness of a photoresist through cross-linking reaction of a deposit and the photoresist, comprising:

providing a substrate having a photoresist pattern;

performing sequentially an exposure process and a post-exposure bake process to activate a surface of the photoresist pattern; and covering a material layer over the activated surface of the photoresist pattern, so that the material layer cross-links with hydrogen ions on the surface of the photoresist pattern to form a filling layer, wherein the filling layer can fill up rough regions in the surface of the photoresist pattern.

11. The method as claimed in claim 10, wherein a material of the material layer is selected from the group consisting of hexamethyldisilazane, dimethylsilyldiethylamine and Bis(dimethylamino)dimethylsilane.

12. The method as claimed in claim 10, wherein the photoresist pattern can be formed by either positive photoresist or negative photoresist.

* * * * *